United States Patent [19]

Pfiester

[11] Patent Number: 5,616,948
[45] Date of Patent: Apr. 1, 1997

[54] SEMICONDUCTOR DEVICE HAVING ELECTRICALLY COUPLED TRANSISTORS WITH A DIFFERENTIAL CURRENT GAIN

[75] Inventor: James R. Pfiester, Austin, Tex.

[73] Assignee: Motorola Inc., Schaumburg, Ill.

[21] Appl. No.: 459,198

[22] Filed: Jun. 2, 1995

[51] Int. Cl.⁶ .............................. H01L 29/76; H01L 27/11
[52] U.S. Cl. ........................ 257/412; 257/413; 257/655; 257/903; 257/904
[58] Field of Search ...................... 257/412, 413, 257/655, 903, 904; 365/154, 156

[56] References Cited

U.S. PATENT DOCUMENTS

| 5,371,026 | 12/1994 | Hayden et al. | 257/903 |
| 5,373,170 | 12/1994 | Pfiester et al. | 257/69 |

FOREIGN PATENT DOCUMENTS

| 4-335576 | 11/1992 | Japan | 257/69 |

OTHER PUBLICATIONS

Shuji Ikeda et al., "A Stacked Split Word–Line (SSW) cell for low voltage operation, large capacity, high speed SRAMs", 1993, IEEE, pp. 33.1.1–33.1.4.

C.Y. Wong et al., "Doping Of N+ and P+ Polysilicon In A Dulal–Gate CMOS Process", 1988, IEEE, pp. 238–241.

Rafael Rios et al., "Determination of Ultra–Thin Gate Oxide Thicknesses for CMOS Structures Using Quantum Effects", 1994, IEEE, pp. 25.6.1–25.6.4.

*Primary Examiner*—Minh-Loan Tran
*Attorney, Agent, or Firm*—Jasper W. Dockrey

[57] ABSTRACT

A semiconductor device includes a pass transistor (28) electrically coupled to a driver transistor (16) by a common drain region (52). The pass transistor (28) includes the pass gate electrode (44) having a polycrystalline silicon layer (68). The driver transistor (16) includes a driver gate electrode (40) having a polycrystalline silicon layer (74). The dopant concentration in polycrystalline silicon layer (74) is greater than the dopant concentration in polycrystalline silicon layer (68). The differential and dopant concentration between the pass gate electrode (44) and the driver gate electrode (40) results in a greater current gain in the driver transistor (16) relative to the pass transistor (28). When incorporated into an SRAM memory cell (10), the driver transistor (16) and the pass transistor (28) provide greater cell stability by improving the immunity of the cell to electrical disturbance through the pass transistor (28).

12 Claims, 3 Drawing Sheets

SEMICONDUCTOR DEVICE HAVING ELECTRICALLY COUPLED TRANSISTORS WITH A DIFFERENTIAL CURRENT GAIN

RELATED APPLICATION

Related subject matter is disclosed in, commonly assigned application Ser. No. 08/334,986 filed Nov. 7, 1994 for "Semiconductor Device Having A Buried Channel Transistor."

FIELD OF THE INVENTION

This invention relates, in general, to semiconductor devices and to methods of fabrication, and more particularly, to a semiconductor device wherein paired MOS transistors have a current-gain differential.

BACKGROUND OF THE INVENTION

In many very-large-scale-integrated-circuit (VLSI) devices there is a need to fabricate transistors that have different electrical performance characteristics. For example, static-random-access-memory (SRAM) cells suffer stability problems as the cell size is reduced. To function properly, the SRAM memory cell, when charged, must hold a voltage level, either high (logic 1) or low (logic 0). When reading data from the cell, the charge pulse generated as the pass transistor turns on must not flip the voltage level at the output nodes. To stabilize the cell, the driver transistor is fabricated to have a higher current gain than the access transistor. Usually, the current gain relationship is controlled by adjusting the width-to-length (W/L) ratio of the driver transistor relative to that of the access transistor. The ratio of the W/L values of the two transistors is known as the cell ratio and is commonly specified to be at least 3.0 or larger.

The physical adjustment of the W/L ratio for an metal-oxide-semiconductor (MOS) transistor requires a dimension change in either the width or the length of the gate electrode. In a VLSI circuit, where component sizes are typically reduced as much as possible, a constraint is placed on the maximum dimension of both the width and the length of the gate electrodes used in a the circuit. This constraint limits the ability of a circuit designer to affect a parameter, such as an SRAM cell ratio. The cell designer is not free to arbitrarily select large values for one dimension relative to the other dimension in order to achieve the desired W/L ratio.

Recognizing a need to control the performance characteristics of one MOS transistor relative to that of another by means other than changing physical dimensions of the gate, technologists have developed other methods to control transistor performance characteristics. In one method, the control of the current gain of an access transistor relative to a driver transistor is achieved by changing the doping concentration in the source-drain region. The gain of the access transistor is reduced by omitting the N+ source region when forming the access transistor. While this method is effective in changing current gain, the alteration of the source electrical field relative to the drain electric field can result in asymmetric behavior and poor overall performance.

In another method, the thickness of the gate dielectric is increased in one transistor relative to the other. For example, the thickness of the gate dielectric layer is made large in the access transistor relative to the gate dielectric thickness in the driver transistor. The access transistor having the thicker dielectric layer has a lower current gain than the driver transistor. While changing the dielectric thickness is effective in altering current gain, additional high-precision processing steps are necessary to obtain an exact dielectric thickness differential between the two transistors.

Although the techniques described above overcome the limitations inherent in adjusting the dimensions of a gate electrode in a VLSI circuit, still more exact control of the current-gain parameter is needed to meet the demands of ever smaller circuit designs. In achieving a desired current gain differential, the method used must not result in abnormal transistor performance, such as asymmetric performance characteristics, and must be readily manufacturable.

SUMMARY OF THE INVENTION

In practicing the present invention there is provided a semiconductor device, which includes a first transistor electrically coupled to a second transistor. The current gain of the second transistor made to be greater than the current gain of the first transistor by generating a greater number of charge carriers in the gate electrode of the second transistor relative to gate electrode in the first transistor. In one embodiment of the invention, a substrate is provided having first and second channel regions therein. The first and second channel regions are separated by a doped region. A first gate electrode having a first dopant concentration overlies the first channel region, and is separated therefrom by a first dielectric layer. A second gate electrode having a second dopant concentration overlies the second channel region, and is separated therefrom by a second dielectric layer. The second dopant concentration is greater than the first dopant concentration. The differential in dopant concentration between the first and second gate electrodes generates a difference in the population of charge carriers in the first and second channel regions. The differential in the charge carrier population, in turn, results in a greater current handling capability in the second transistor relative to the first transistor.

DETAILED DESCRIPTION OF PREFERRED EMBODIMENTS

This invention provides a device structure in which two MOS transistors are electrically coupled, and wherein one of the two transistors has a higher current gain. The inventive structure obtains the differential gain relationship without utilizing a large amount of substrate surface area. Paired MOS transistors having a current gain differential can be advantageously employed in many different integrated circuit devices. For example, in SRAM devices, the pass transistors control bit-line pass to the driver transistors, but must not generate as much drive current as the driver transistors. Depending upon the particular configuration and sequence of photomasking layers, the device of the present invention can be fabricated as an integral part of a complete process further employing additional process steps to fabricate other MOS devices, such as a dynamic-random-access-memory (DRAM) device, a microprocessor device, a bipolar-complementary-MOS (Bi-CMOS) device, and the like.

Figure 1:
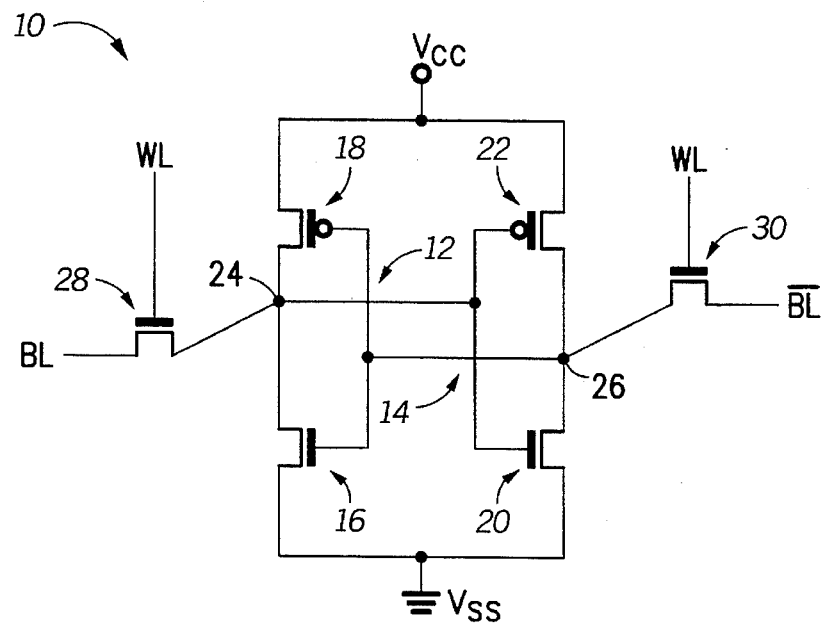
FIG. 1 is a schematic circuit diagram of an SRAM memory cell interconnected in accordance with the invention.

Shown in FIG. 1 is schematic circuit diagram of an SRAM memory cell 10. Memory cell 10 includes two cross-coupled, CMOS inverters 12 and 14. CMOS inverter 12 includes a driver transistor 16 and a thin-film, load transistor 18. Similarly, CMOS inverter 14 includes a driver transistor 20 and a thin-film, load transistor 22. The inverters are cross-coupled at nodes 24 and 26. Pass transistors 28 and 30 are also coupled to the outputs of inverters 12 and 14 at nodes 24 and 26, respectively. Pass transistors 28 and 30 provide bit line pass to memory cell 10.

In a preferred embodiment, the driver transistors and the pass transistors are formed on a semiconductor substrate 11, and the thin-film load transistors are formed in thin-film layers overlying the driver and pass transistors. One embodiment of memory cell 10 illustrating the layout of the driver transistors and the pass transistors is shown in the plan view of FIG. 2. Wordlines 32 and 34 overlie active regions 36 and 38, respectively. A portion of wordline 32 overlying active region 36 forms the gate electrode of pass transistor 28. Similarly, a portion of wordline 34 overlying active region 38 forms the gate electrode of pass transistor 30. Driver transistors 16 and 20 are formed in active regions 36 and 38, respectively. A driver gate electrode 40 of driver transistor 16 contacts active region 38 at node 26 and overlies a portion of active region 36. Similarly, a driver gate electrode 42 of driver transistor 20 contacts active region 36 at node 24 and overlies a portion of active region 38. Those skilled in the art will appreciate that many different arrangements are possible for the layout of the active regions and the driver and pass transistors. While only one possible layout is described herein, the present invention contemplates different arrangements and geometric relationships between the various components.

Figure 2:
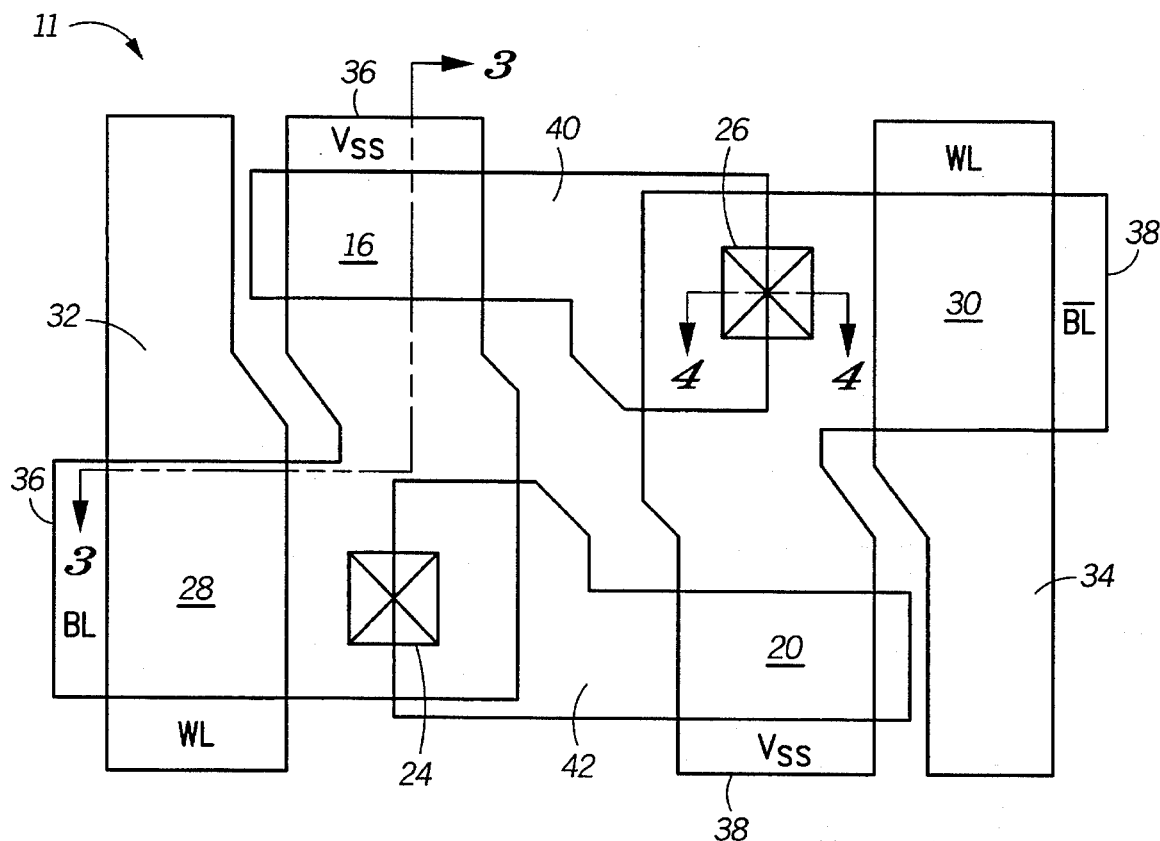
FIG. 2 illustrates, in plain view, one embodiment of the SRAM memory cell arranged in accordance with the invention.
Figure 3:
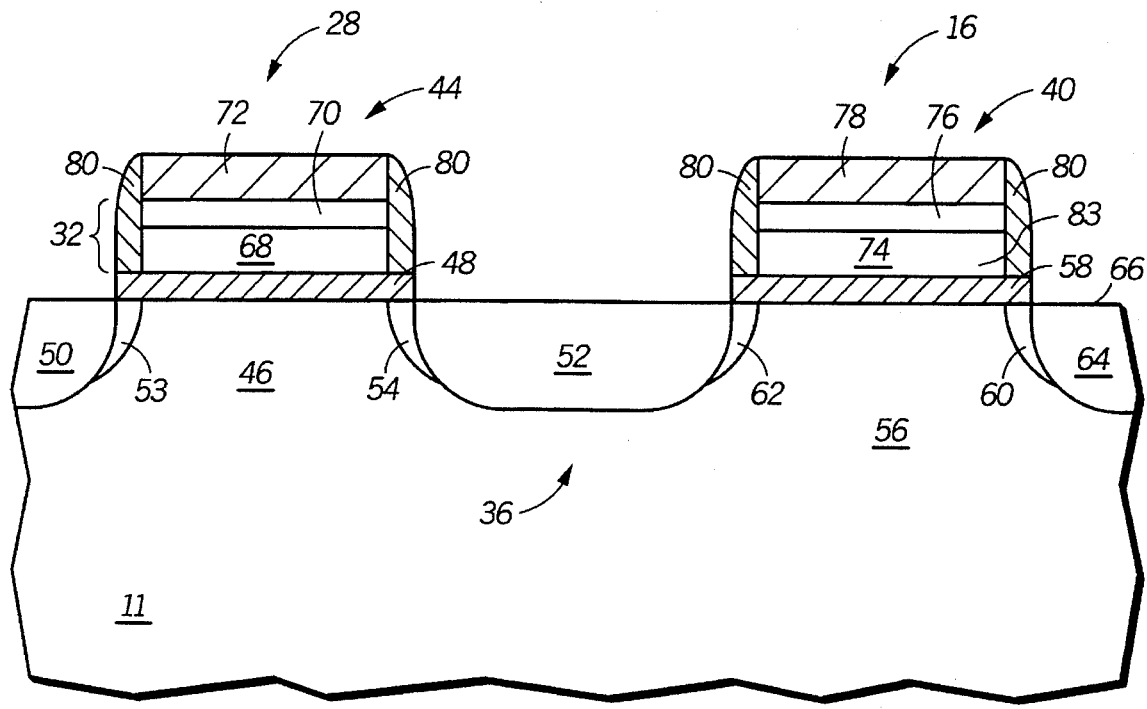
FIG. 3 illustrates, in cross-section, a portion of the memory cell shown in FIG. 2 taken along section lines 3—3 and arranged in accordance with one embodiment of the invention.

Shown in FIG. 3 is a cross sectional view of the memory cell illustrated in FIG. 2, taken along section line 3—3. Pass transistor 28 and driver transistor 16 are shown in cross-sectional view through active region 36. A portion of wordline 32 overlying active region 36 functions as a pass gate electrode 44. Pass gate electrode 44 is separated from a first channel region 46 by a gate dielectric layer 48. First channel region 46 lies intermediate to a source region 50 and a drain region 52. In the preferred embodiment, lightly doped source and drain regions 53 and 54, respectively, are formed adjacent to either side of channel region 46.

Driver gate electrode 40 overlies a second channel region 56 and is separated therefrom by a gate dielectric layer 58. Channel region 56 resides in substrate 11 intermediate to lightly doped source and drain regions 60 and 62. A source region 64 resides adjacent to lightly doped source region 60. Pass transistor 28 and driver transistor 16 are electrically coupled by drain region 52. A bit-line contact (designated BL in FIG. 2) is formed to couple a bit-line signal with source region 50 of pass transistor 28. Correspondingly, a $V_{SS}$ signal is electrically coupled to a source region 64 by means of a $V_{SS}$ contact (designated $V_{SS}$ in FIG. 2). Both the bit-line contact and the Vss contact are made to a surface 66 of active region 36.

As illustrated in FIG. 3, pass gate electrode 44 includes a polycrystalline silicon layer 68 overlying gate dielectric layer 48, and a tungsten silicide layer 70 overlying polycrystalline silicon layer 68. An insulating cap 72 overlies tungsten silicide layer 70. Driver gate electrode 40 includes a polycrystalline silicon layer 74 overlying gate dielectric layer 58, and a tungsten silicide layer 76 overlying polycrystalline silicon layer 74. An insulating cap 78 overlies tungsten silicide layer 76. Both pass gate electrode 44 and driver gate electrode 40 are encapsulated by insulating sidewall spacers 80 overlying the edges of both gate electrodes.

Figure 4:
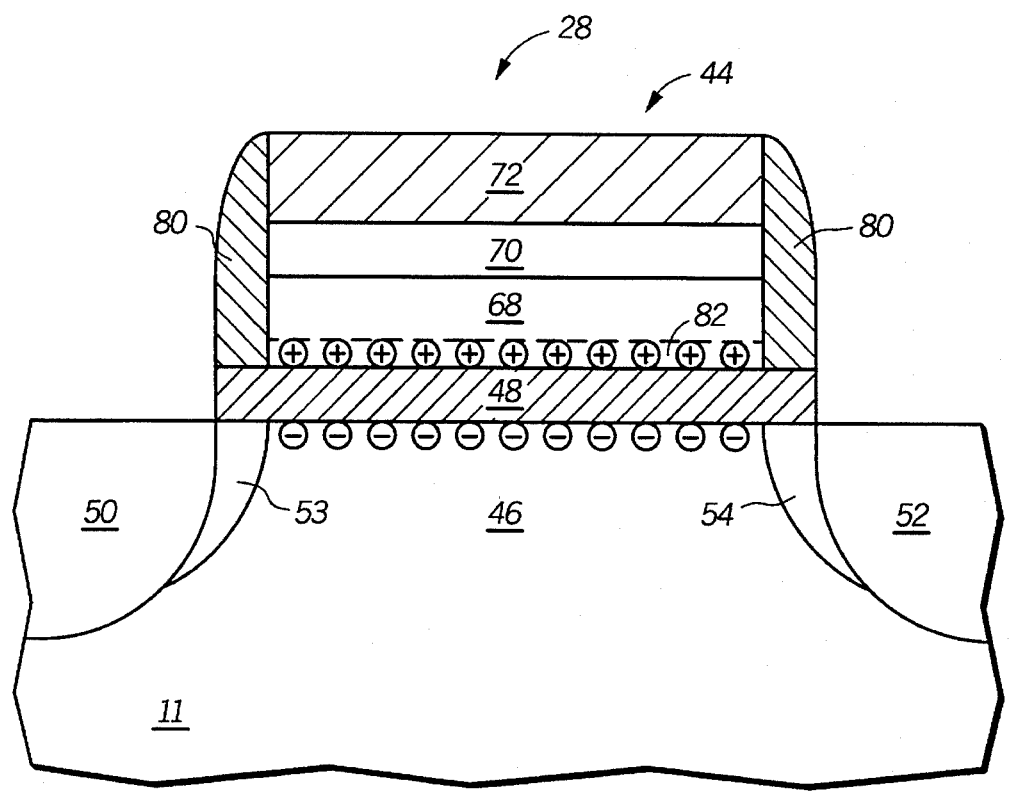
FIG. 4 illustrates, in cross-section, an enlarged portion of a transistor formed in accordance with one embodiment of the invention.

A current gain differential between pass transistor 28 and driver transistor 16 is created through a differential in the charge density between pass gate electrode 44 and driver gate electrode 40. A magnified view of pass transistor 28 is illustrated in FIG. 4. Polycrystalline silicon layer 68 includes a first interface layer 82 in contact with gate dielectric layer 48. Polycrystalline silicon layer 68 is doped with n-type dopants such that first interface layer 82 contains a predetermined carrier concentration. When a positive voltage is applied to pass gate electrode 44, positive charge carriers assemble in first interface layer 82 at the interface with gate dielectric layer 48. The positive charge carriers (denoted "+") attract a corresponding number of negative carriers (denoted "−") at the surface of channel region 46 on the opposite side of gate dielectric layer 48.

The amount of electrical current conducted through pass transistor 28 is proportional to the population of charge carriers generated in channel region 46. Since the population of charge carriers in channel region 46 is proportional to the positive charge carrier density in first interface layer 82, the amount of current flowing in pass transistor 28 can be controlled by regulating the charge carrier density in first interface layer 82.

The concentration of charge carriers in first interface layer 82 can be specified to a predetermined value by introducing a controlled concentration of dopant species into polycrystalline silicon layer 68. By doping polycrystalline silicon layer 68 to a given dopant concentration, the charge carrier density in first interface layer 82 will correspond with the dopant concentration level. For example, a high concentration of n-type dopant atoms in polycrystalline silicon layer 68 will correspondingly produce a large carrier population in first interface layer 82 when a positive voltage is applied to pass gate electrode 44. The current handling capability of pass transistor 28 can be reduced by lowering the dopant concentration level in polycrystalline silicon layer 68. Accordingly, one method for obtaining a current gain differential between pass transistor 28 and driver transistor 16 is to introduce a higher n-type dopant concentration in polycrystalline silicon layer 74 than in polycrystalline silicon layer 68. Although not illustrated in magnified view, polycrystalline silicon layer 74 in driver gate electrode 40 includes an interface layer 83, shown in FIG. 3. By increasing the n-type dopant concentration in polycrystalline silicon layer 74 relative to polycrystalline silicon layer 68, driver transistor 16 will have larger population of charge carriers in interface layer 83, and correspondingly, a higher current gain than pass transistor 28. Creating a current gain differential between the driver transistor and the pass transistor will increase the cell ratio of memory cell 10.

Figure 5:
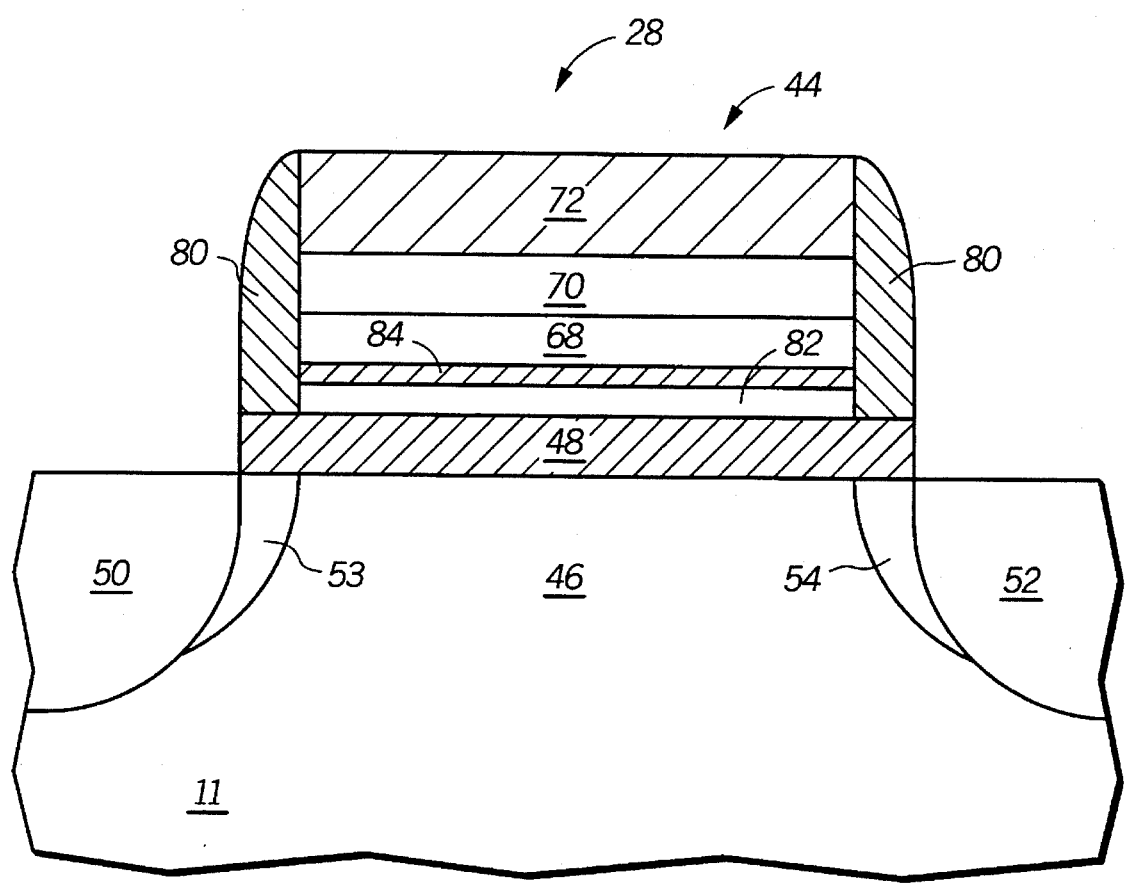
FIG. 5 illustrates, in cross-section, a transistor arranged in accordance with an alternative embodiment of the invention It will be appreciated that for simplicity and clarity of illustration, elements shown in the FIGURES have not necessarily been drawn to scale. For example, the dimensions of some of the elements are exaggerated relative to each other for clarity. Further, where considered appropriate, reference numerals have been repeated among the FIGURES to indicate corresponding elements.

An alternative embodiment of the invention is illustrated in FIG. 5. In the alternative embodiment, the population of positive charge carriers in first interface layer 82 is controlled by placing a conductive silicon nitride layer 84 intermediate to polycrystalline silicon layer 68 and first interface layer 82. Preferably, conductive silicon nitride layer 84 is a silicon-rich silicon nitride material. The composition of conductive silicon nitride layer 84 is adjusted, such that the material is electrically conductive yet the electrical conductivity is less than that of doped polycrystalline silicon. Because conductive silicon nitride layer 84 is more resistive than polycrystalline silicon layer 68, a potential voltage difference is established across conductive silicon nitride layer 84 when a positive voltage is applied to pass gate electrode 44. The potential drop across conductive silicon nitride layer 84 reduces the population of positive charge carriers in first interface layer 82. Accordingly, a corresponding reduction in negative charge carriers in channel region 56 is realized when a positive voltage is applied to pass gate electrode 44.

In addition to generating a potential voltage drop within pass gate electrode 44, conductive silicon nitride layer 84 also functions as a dopant diffusion barrier. When conductive silicon nitride layer 84 is fabricated to overlie first interface layer 82, polycrystalline silicon layer 68 can be doped to a high concentration level independent of first interface layer 82. As previously described, by reducing the dopant concentration in first interface layer 82, the positive charge carrier population can be correspondingly reduced. Thus, fabrication of conductive silicon nitride layer 84 permits pass gate electrode 44 to have a contact portion of high electrical conductivity, while having an interface layer with a much lower dopant concentration. The low dopant concentration of first interface layer 82 will correspondingly reduce the current handling capability of pass transistor 28. Also, it is important to note that in the alternative embodiment interface layer 82 can be intrinsic polycrystalline silicon.

The fabrication of pass transistor 28 and driver transistor 16 as illustrated in FIG. 3 will now be described. First and second channel regions 46 and 56 are formed by doping active region 36 with a p-type dopant species. Then, a sacrificial oxide layer is thermally grown to overlie surface 66. Next, boron atoms are implanted into substrate 11 using an ion implantation dose of about $1.0 \times 10^{12}$ to $3.0 \times 10^{12}$ ions/cm$^2$. Alternatively, indium can be ion implanted into substrate 11 to form channel region 46. To achieve the current gain differential of the present invention, it is important that the threshold voltage of pass transistors and driver transistors be carefully controlled to within the range of about 0.7 to 1.0 volts. Although the preferred embodiment includes an ion implantation process, other methods, such as solid state diffusion, and the like, can be used to form channel regions 46 and 56.

After implanting active region 36, the sacrificial oxide layer is removed and substrate 11 is oxidized form a gate dielectric layer overlying substrate 11. This layer will form gate dielectric layers 48 and 58 shown in FIG. 3. Then, a thin layer of polycrystalline silicon is deposited to overlie the gate dielectric layer. The thin layer of polycrystalline silicon will form interface layer 82 in pass gate electrode 44 and interface layer 83 in driver gate electrode 40, respectively. Other portions of the integrated circuit can now be formed by applying a photoresist pattern and implanting dopants through the thin layer of polycrystalline silicon.

Pass gate electrode 44 and driver gate electrode 40 are fabricated by first depositing a second layer of polycrystalline silicon to overlie the thin polycrystalline silicon layer. The polycrystalline silicon layers are doped to a first conductivity with an n-type dopant, such as phosphorus or arsenic. Next, a photolithographic mask is defined on the surface of the polycrystalline silicon layer, and an ion implantation process is carried out to dope a portion of the polycrystalline silicon layer with an n-type dopant, such as phosphorus or arsenic, to a second conductivity level. The two step doping sequence forms a region of low doping concentration and a region of high doping concentration within the polycrystalline silicon layer. Pass gate electrode 44 will be formed in the region of low dopant concentration, while driver gate electrode 40 will be formed in the region of high dopant concentration.

After the polycrystalline silicon is doped, a layer of tungsten silicide is deposited onto the surface of the second polycrystalline silicon layer. Then, an insulating layer is sequentially deposited to overlie the polycrystalline silicon. Next, photolithographic and reactive ion etching processes are carried out to sequentially etch the insulating layer, the tungsten silicide layer, and the polycrystalline silicon layer.

Upon completion of the etching process, pass gate electrode 44 includes an n-type polycrystalline silicon layer 68, a tungsten silicide layer 70 and an insulating cap 72. Driver gate electrode 40 includes an n-type polycrystalline silicon layer 74, a tungsten silicide layer 76, and an insulating cap 78. After forming the stacked gate structures, an ion implantation process is carried out to form lightly doped source and drain regions 53, 54, 63, and 64. Preferably, an n-type dopant, such as arsenic or phosphorous, is used to impart n-type conductivity to the lightly doped source and drain regions. For example, phosphorus can be implanted to a dose of about $1.0 \times 10^{12}$ to $5.0 \times 10^{14}$ ions/cm$^2$ at an implant energy of about 20 to 50 keV.

Next, an insulating layer, such as silicon nitride, is deposited to overlie the surface of substrate 11, and a reactive ion etching process is carried out to form sidewall spacers 80 adjacent to gate electrodes 40 and 44. Then, a second ion implantation process is performed to form n-type source and drain regions 50, 52, and 62. For example, an n-type dopant, such as phosphorus or arsenic, can be implanted to a dose of about $1.0 \times 10^{15}$ to $1.0 \times 10^{16}$ ions/cm$^2$ at an implantation energy of about 20 to 50 keV.

The fabrication of pass transistor 28 in accordance with the alternative embodiment of the invention, is substantially the same as that of the first embodiment. A layer of silicon-rich silicon nitride is deposited to overlie the thin polycrystalline silicon layer. Then, a second polycrystalline layer is deposited to overlie the silicon-rich silicon nitride layer. The remaining fabrication steps proceed as described for the foregoing embodiment of the invention.

Thus it is apparent that there has been provided, in accordance with the invention, a semiconductor device which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, in an alternative method, the silicon-rich silicon nitride layer can be formed intermediate to the polycrystalline silicon layer and the tungsten silicide layer. The potential voltage drop will occur across the silicon-rich silicon nitride layer regardless of its specific location within the pass gate electrode. It is therefore intended to include within the invention all such variations and modifications as fall within the scope of the appended claims and equivalents thereof.

I claim:

1. A static-random-access memory cell comprising:
   a semiconductor substrate having an active region therein;
   a first channel region and a second channel region in the active region, the first and second channel regions having a first carrier concentration therein;
   a doped region electrically coupling the first channel region and the second channel region;
   a gate dielectric layer overlying the first and second channel regions;
   a pass gate electrode overlying the first channel region and separated therefrom by the gate dielectric layer;
   a first interface layer in the pass gate electrode contacting the gate dielectric layer, the first interface layer having a second carrier concentration;
   a driver gate electrode overlying the second channel region and separated therefrom by the gate dielectric layer; and
   a second interface layer in the driver gate electrode contacting the gate dielectric layer, the second interface layer having a third carrier concentration,
   wherein the third carrier concentration is greater than the second carrier concentration, and wherein the gate dielectric layer has substantially equal thickness at the pass and driver gate electrodes.

2. The memory cell of claim 1, wherein the pass gate electrode further comprises:
   a conductive silicon nitride layer overlying the first interface layer; and
   a first polycrystalline silicon layer overlying the conductive silicon nitride layer.

3. The memory cell of claim 1, wherein the driver gate electrode further comprises:
   a portion of a polycrystalline silicon layer, wherein the portion overlies the second interface layer; and
   a tungsten silicide layer overlying the portion of the polycrystalline silicon layer.

4. The memory cell of claim 1 further comprising:
   a first dopant of a first conductivity type in the first interface layer, the first dopant having a first dopant concentration; and
   a second dopant of a first conductivity type in the second interface layer, the second dopant having a second dopant concentration,
   wherein the second dopant concentration is greater than the first dopant concentration.

5. A static-random-access memory cell comprising:
   a semiconductor substrate having a gate dielectric layer thereon;
   pass and driver gate electrodes overlying the gate dielectric layer;
   a first layer of a first conductivity type in the pass gate electrode contacting the gate dielectric layer and having a first dopant concentration;
   a second layer of the first conductivity type in the driver gate electrode contacting the gate dielectric layer and having a second dopant concentration that is greater than the first dopant concentration;
   a first channel region in the semiconductor substrate underlying the pass gate electrode;
   a second channel region in the semiconductor substrate underlying the driver gate electrode; and
   a doped region of the first conductivity type in the substrate electrically coupling the first channel region to the second channel region,
   wherein the gate dielectric layer has substantially equal thickness at the pass and driver gate electrodes.

6. The memory cell of claim 5, wherein the pass gate electrode, the driver gate electrode, and the doped region have n-type conductivity.

7. A static-random-access memory cell comprising:
   a substrate of a first conductivty type having a surface;
   a gate dielectric layer;
   a pass transistor having a pass gate electrode of a second conductivity type and having a first dopant concentration, wherein:
   the pass transistor is characterized by a first current gain; and
   the pass gate electrode overlies the gate dielectric layer; and
   a driver transistor electrically coupled to the pass transistor, the driver transistor having a driver gate electrode of the second conductivity type and having a second dopant concentration, wherein:
   the driver transistor is characterized by a second current gain,
   the second dopant concentration is greater than the first dopant concentration,
   the driver gate electrode overlies the gate dielectric layer;
   the gate dielectric layer has substantially equal thickness at the pass and driver gate electrodes; and
   the second current gain of the driver transistor is greater than the first current gain of the pass transistor.

8. The memory cell of claim 7 further comprising a first substrate region of the second conductivity type in the substrate intermediate to the pass and driver gate electrodes electrically coupling the pass transistor to the driver transistor.

9. The memory cell of claim 7 wherein the gate dielectric layer overlies the surface of the substrate and separates the pass and driver gate electrodes therefrom.

10. A static-random-access memory cell comprising:
    a substrate having a surface;
    first and second channel regions in the substrate separated by a first N-type doped region;
    a gate dielectric layer;
    a first N-type gate electrode having a first dopant concentration overlying the first channel region and separated therefrom by the gate dielectric layer, wherein the first N-type gate electrode is a pass gate electrode and overlies the gate dielectric layer; and
    a second N-type gate electrode having a second dopant concentration overlying the second channel region and separated therefrom by the gate dielectric layer, wherein:
    the second N-type gate electrode is a driver gate electrode and overlies the gate dielectric layer;
    the gate dielectric layer has substantially equal thickness at the pass and driver gate electrodes,
    wherein the second dopant concentration is greater than the first dopant concentration.

11. The memory cell of claim 10, wherein the first channel region and the second channel region are associated with a pass transistor and a driver transistor, respectively, of the memory cell, and wherein the first N-type doped region is a common drain region.

12. The memory cell of claim 10 further comprising a refractory metal silicide region overlying the first N-type gate electrode and the second N-type gate electrode.

* * * * *